(12) United States Patent
Inagaki et al.

(10) Patent No.: US 6,204,914 B1
(45) Date of Patent: Mar. 20, 2001

(54) PRINTING APPARATUS OF PHOTOSENSITIVE MICROCAPSULE TYPE AND IMAGE PROCESSING SYSTEM USING THE SAME

(75) Inventors: Shigeru Inagaki; Hidenori Fujioka, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/277,514

(22) Filed: Mar. 26, 1999

(30) Foreign Application Priority Data

Mar. 27, 1998 (JP) .................................................. 10-082059
Jan. 14, 1999 (JP) .................................................. 11-008086

(51) Int. Cl.$^7$ .............................. G03D 5/00; G03G 21/00
(52) U.S. Cl. ......................... 355/402; 355/406; 430/138; 347/262
(58) Field of Search ..................................... 355/400, 401, 355/402, 403, 404, 405, 406, 407, 408; 430/138; 347/262, 264

(56) References Cited

U.S. PATENT DOCUMENTS 4,648,699 * 3/1987 Holycross et al. .................... 355/406
5,433,543 * 7/1995 Sturman .............................. 400/314

FOREIGN PATENT DOCUMENTS

650845 A2   5/1995   (EP) .

* cited by examiner

Primary Examiner—Alan A. Mathews
(74) Attorney, Agent, or Firm—Adams & Wilks

(57) ABSTRACT

A printing apparatus of a photosensitive microcapsule type comprises a chassis, a cassette for storing printing paper containing photosensitive microcapsules, a printing paper feeding device for intermittently feeding the printing paper in a feeding direction, and a printing paper pickup device for feeding the printing paper from the cassette to a preselected location from which the printing paper is intermittently fed by the printing paper feeding device. A scan shaft is mounted on the chassis for undergoing rotation about a rotational axis extending generally perpendicular to the feeding direction of the printing paper. A first spiral groove is formed in the scan shaft along a clockwise direction and has opposite ends. A second spiral groove is formed in the scan shaft along a counterclockwise direction and has opposite ends each connected to a respective end of the first spiral groove so that the first and second spiral grooves form a loop. A carriage is slidably mounted on the scan shaft for undergoing reciprocal movement along the scan shaft during rotation of the scan shaft. Light emitting diodes are disposed on the carriage for selectively irradiating onto the printing paper light corresponding to image data when the carriage is reciprocated along the scan shaft. A pressurizing device applies pressure to the printing paper to which light is irradiated by the light emitting diodes to collapse the photosensitive microcapsules contained in the printing paper to form an image on the printing paper.

23 Claims, 3 Drawing Sheets

PRINTING APPARATUS OF PHOTOSENSITIVE MICROCAPSULE TYPE AND IMAGE PROCESSING SYSTEM USING THE SAME

BACKGROUND OF THE INVENTION

1. Field of the Invention

The present invention relates to a printing apparatus of a photosensitive microcapsule type for irradiating light corresponding to image data onto printing paper of a photosensitive microcapsule type to selectively cure photosensitive microcapsules, and after that, applying pressure to collapse the microcapsules which have not cured, and developing the color of a color developing material which is brought into contact with an image receiving layer to generate an image, and to an image processing system with a printing apparatus of a photosensitive microcapsule type.

2. Description of the Related Art

Conventional printing paper of a photosensitive microcapsule type is divided into a roll film with microcapsules applied to the surface thereof, which microcapsules encapsulate a color developing material in combination with a photo-curing material, and a sheet paper with an image receiving layer applied to the surface thereof for carrying out development by closely adhering the image receiving layer to the surface of the roll film to which the microcapsules are applied.

In a printing apparatus using the conventional printing paper of a photosensitive microcapsule type, first, while the roll film is being fed, light is irradiated correspondingly to image data to selectively cure the photo-curing material. Next, the surface of the roll film to which the microcapsules are applied and the image receiving layer of the sheet paper are overlapped and are guided between rolling rolls, and pressure is applied to collapse microcapsules which have not cured. Further, heat is applied to facilitate the color development of the color developing material which comes into contact with the image receiving layer to generate an image on the sheet paper. Finally, the roll film is separated from the sheet paper and is wound.

Accordingly, in the conventional printing apparatus, a cassette for containing a stack of sheet papers with the image receiving layer applied thereto is adopted to be inserted in a chassis. The conventional printing apparatus comprises a roll film supporting device for attaching thereto a roll film with microcapsules applied thereto, a winding device for winding the roll film thereon, a feed roll for feeding the roll film, a pickup roll for feeding a sheet paper from the cassette, exposure means for irradiating onto printing paper fed from the cassette while flashing light of a predetermined wavelength correspondingly to image data inputted from the external to make uncollapsible the microcapsules which get the light, pressurizing means for guiding between a pair of rolling rolls and applying pressure to the roll film and the sheet paper which are overlapped and selectively collapsing microcapsules which did not get the light and have not cured to get in contact with the image receiving layer to cause color developing reaction of the color developing material, heating means for applying heat to the color developing material capable of the color developing reaction by getting in contact with the image receiving layer to facilitate the color development to generate an image on the printing paper, a motor, power transmitting means for transmitting the rotation of the motor to movable elements including the pickup roll and the feed roll, and a controller for controlling the apparatus.

In order to know whether the printing paper contained in the cassette is monochrome or full color, or whether the printing paper is highly sensitive or not, and the like, paper with a bar code printed thereon on top of the top printing paper is fed to read and decode the bar code thereby specifying the kind of the printing paper and, according to the kind of the printing paper, the intensity or irradiation time of the light of the predetermined wavelength is changed.

The conventional printing apparatus has the following problems.

(1) Since the printing paper is divided into the roll film and the sheet paper, the film and the sheet paper are required to be separately supplied and wound, and thus, the size of the apparatus is large (desktop size).

(2) In case the cassette is exchanged before all the printing paper is used up and then, the original cassette is again replaced, since the paper with the bar code printed thereon necessary for knowing whether the printing paper is highly sensitive or not can not be fed again, the kind of the printing paper can not be specified. Therefore, it is not possible to exchange the cassette before all the printing paper is used up and then replace again the original cassette, and it is necessary that all the printing paper is used up. For that reason, it was not possible to select such an option that sepia color is first printed and then full color printing is carried out.

SUMMARY OF THE INVENTION

The present invention provides a printing apparatus of a photosensitive microcapsule type which can make printing paper of a photosensitive microcapsule type generate an image by irradiating light corresponding to image data to selectively cure photosensitive microcapsules, and after that, applying pressure to collapse microcapsules which have not cured, and developing the color of a color developing material which is brought into contact with an image receiving layer, and in particular, which can be microminiaturized to be as small as a cigarette case, and, an image processing system with the printing apparatus.

Further, the present invention provides a printing apparatus of a photosensitive microcapsule type by which the kind of the printing paper can be specified even if a cassette is freely exchanged before all the printing paper is used up, and an image processing system with a printing apparatus.

In order to solve the above problems, according to the present invention, a printing apparatus of a photosensitive microcapsule type comprises printing paper feeding means for intermittently feeding printing paper of a photosensitive microcapsule type, and a scan having an axial direction disposed perpendicular to the feeding direction of the printing paper, opposite ends pivotably supported by a chassis, and a clockwise spiral groove and a counterclockwise spiral groove grooved so as to cross each other on the way such that both ends of the grooves are connected to form a. The printing apparatus further comprises a motor attached to the chassis for rotating the scan shaft, a carriage slidably fitted on the scan shaft and having a pin engaged with the spiral groove to reciprocate the carriage by the rotation of the scan shaft, light emitting diodes provided on the carriage and in proximity of the printing paper for selectively irradiating onto the printing paper light corresponding to image data when the carriage scans, and pressurizing means for applying pressure to the printing paper to which light is irradiated for selectively collapsing photosensitive microcapsules to develop color thereby to generate an image.

Further, according to the present invention, a printing apparatus of a photosensitive microcapsule type comprises a cassette for containing printing paper of a photosensitive microcapsule type, and printing paper pickup means for, when the cassette is inserted in a cassette insert opening in a case, feeding manually or automatically the printing paper to a place from which the printing paper is intermittently fed by the printing paper feeding means.

Further, according to the present invention, a printing apparatus of a photosensitive microcapsule type is structured such that the printing paper feeding means is made to intermittently feed the printing paper through an intermittently rotating mechanism by the motor or another motor.

Further, according to the present invention, a printing apparatus of a photosensitive microcapsule type is structured such that the printing paper feeding means comprises a protruding member provided on the carriage for elastically protruding from and withdrawing into the carriage, a paper feed roller having a rotational center axis in parallel with the moving direction of the carriage, and a plurality of operating grooves, a section thereof being ratchet-like, formed in an outer peripheral portion of the paper feed roller to have a helix angle with respect to the axial direction of the roller and to be in parallel with one another, for engaging with the protruding member, the paper feed roller is rotated by a divided angle of the operating grooves during returning movement when the carriage returns to a print start position.

Further, according to the present invention, a printing apparatus of a photosensitive microcapsule type is structured such that the pressurizing means is provided on the carriage so as to pressurize and roll on the printing paper guided onto a platen.

Further, according to the present invention, a printing apparatus of a photosensitive microcapsule type is structured such that the pressurizing means is a pair of rolling rolls provided on said carriage and circumscribing with each other, one of the rolling rolls being made to roll on the printing paper guided by a platen encouraged by a spring and the other of the rolling rolls being made to roll on a pressurization rail fixedly provided in the scanning direction.

Further, according to the present invention, a printing apparatus of a photosensitive microcapsule type comprises a heater as a heating means for accelerating the color developing speed of an image generated on the pressurized printing paper so as to be in slidable contact with the printing paper.

Further, according to the present invention, a printing apparatus of a photosensitive microcapsule type is provided with scanning position detecting means for detecting the scanning position of the carriage.

Further, according to the present invention, a printing apparatus of a photosensitive microcapsule type is structured such that the scanning position detecting means comprises a linear scale fixedly provided along the scanning position of the carriage and a linear sensor provided on the carriage, and that the linear sensor reads the linear scale to detect the scanning position of the carriage.

Further, according to the present invention, a printing apparatus of a photosensitive microcapsule type is structured such that the scanning position detecting means comprises a tachogenerator provided in the motor for detecting the rotational angle or the number of rotations of the motor, and that the scanning position of the carriage is detected based on the rotational angle or the number of rotations of the motor detected by the tachogenerator.

Further, according to the present invention, a printing apparatus of a photosensitive microcapsule type is structured such that a bar code is provided at a predetermined position of the cassette on the side of insertion, that a bar code sensor is attached to the carriage, and that the bar code sensor reads the bar code of the cassette so as to specify the kind of the printing paper.

Further, according to the present invention, an image processing system with a printing apparatus of a photosensitive microcapsule type is structured such that the above printing apparatus is connected with an image processing apparatus so that image signals can be exchanged therebetween.

BRIEF DESCRIPTION OF THE DRAWINGS

For a more better understanding of the present invention, reference is made of a detailed description to be read in conjunction with the accompanying drawings, in which.

DETAILED DESCRIPTION OF THE PREFERRED EMBODIMENTS

First, the structure of an image processing system having a printing apparatus and an image processing apparatus according to an embodiment of the present invention is described with reference to the drawings.

Figure 1:
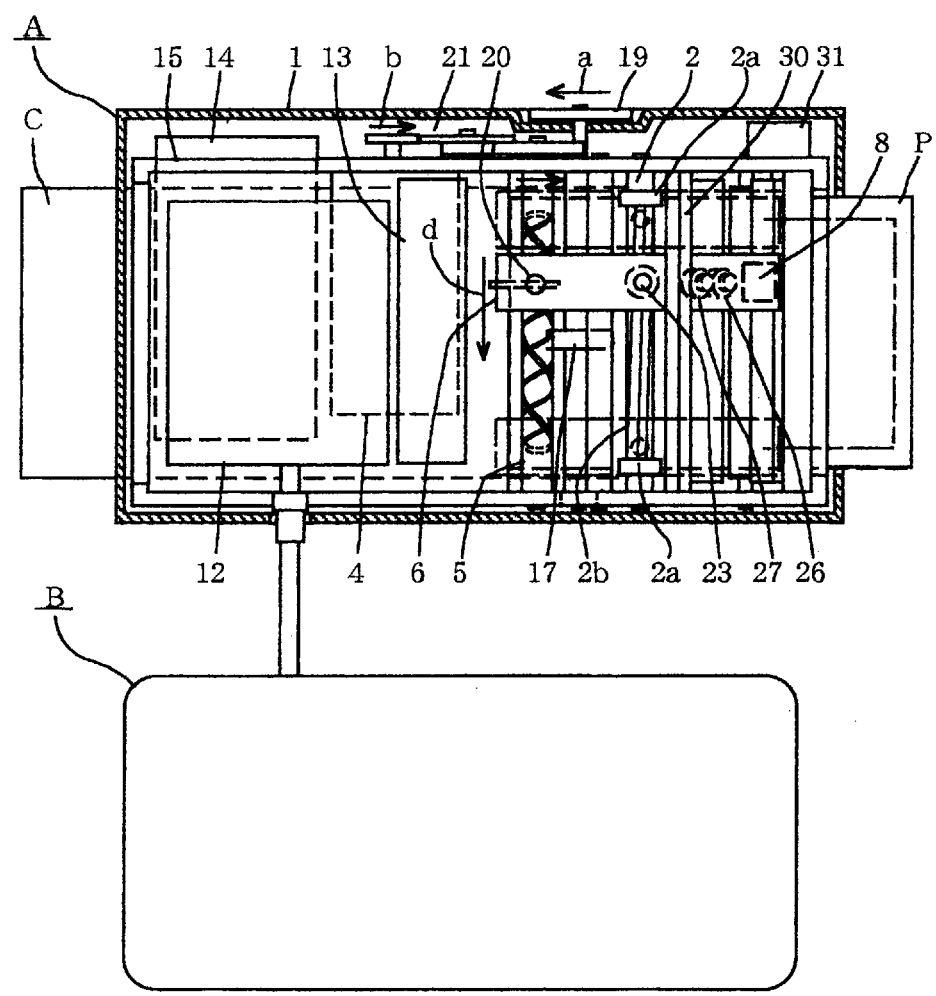
FIG. 1 is a plan view of an embodiment of a printing apparatus of a photosensitive microcapsule type according to the present invention and an image processing system using it.
Figure 2:
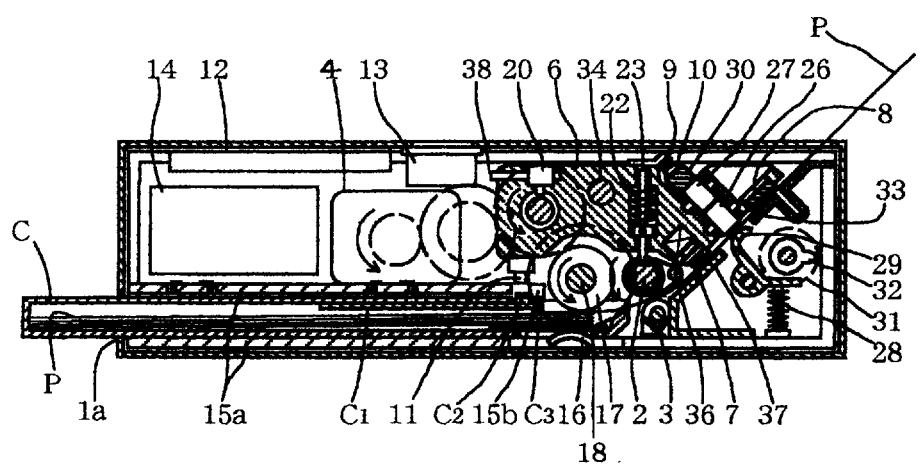
FIG. 2 is a vertical sectional side view of the embodiment of a printing apparatus of a photosensitive microcapsule type according to the present invention.
Figure 3:
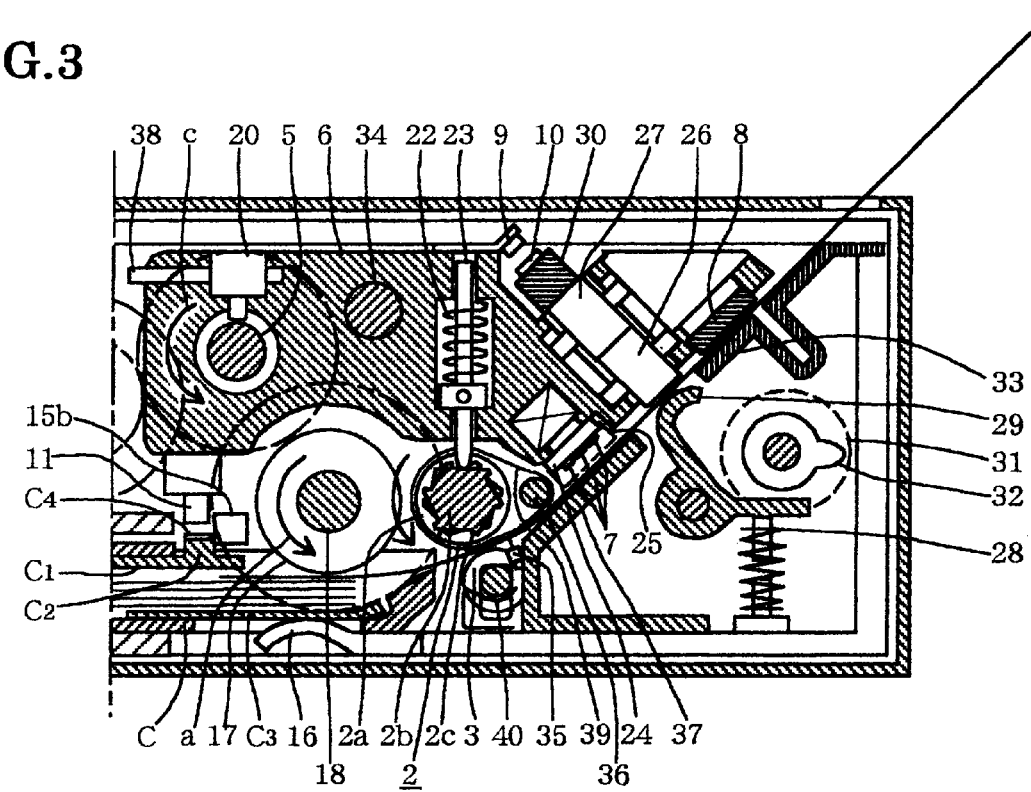
FIG. 3 is a partial enlarged vertical sectional side view of the embodiment of a printing apparatus of a photosensitive microcapsule type according to the present invention.

FIG. 1 is a plan view of a system of substantially the actual size of a printing apparatus of a photosensitive microcapsule type and a digital camera. FIG. 2 is a vertical sectional side view of the printing apparatus of a photosensitive microcapsule type. FIG. 3 is a partial enlarged vertical sectional side view of the printing apparatus of a photosensitive microcapsule type.

As shown in FIG. 1, in this system, when a power switch which is not shown is turned on, image data stored in an image processing apparatus B is selected, and a print image output switch which is not shown is turned on, a printing apparatus A carries out printing.

As shown in FIG. 1 to FIG. 3, the printing apparatus A is formed of a printing paper pickup means for, with a cassette C being inserted in a case 1, feeding the top printing paper P until it is sandwiched between a ratchet roll 2 and a pinch roll 3, a printing paper feeding means in which the ratchet roll 2 is intermittently rotated through an intermittently rotating mechanism to intermittently feed the printing paper with the ratchet roll 2 and the pinch roll 3, a scan shaft 5 having an endless spiral groove rotated by a motor 4, a carriage 6 slidably fitted on a guide shaft 34 to be reciprocated by the rotation of the scan shaft 5, light emitting diodes 7 provided on the carriage 6 for irradiating onto the printing paper P light corresponding to image data, a pressurizing means provided on the carriage 6 for applying pressure to the printing paper P, a color development facilitating means provided on the carriage 6 for facilitating the color development in which a heater 8 is in slidable contact with the printing paper P to heat the printing paper, a scanning position detecting means for detecting the scanning position of the carriage 6 by reading the graduations of a linear scale 10 with a linear sensor 9, a printing paper specifying means for specifying the kind of the printing paper contained in the cassette by reading a bar code C4 of the cassette C with a bar code sensor 11, a controller 12, an input display device 13, and a battery 14.

The cassette C contains a stack of, for example, ten sheets of the printing paper P. In the printing paper P, an image receiving layer is applied to a mount. Microcapsules having the diameter of about 4 microns are uniformly applied over the image receiving layer. Further, a polyester film is laminated. The microcapsules encapsulate a color developing material which is transparent before color development and develops color by chemical reaction with the image receiving layer, which reaction is facilitated to speedily develop the color when heated, together with a photo-curing material which is transparent both before and after the color development and photo-cures when it gets light of a predetermined wavelength. By collapsing the microcapsules, the color developing material is brought into contact with the image receiving layer. If heat is applied, the color development is accelerated. As the printing paper P, there are one in which one kind of microcapsules are applied to develop color of a monochrome gray scale, one in which three kinds of microcapsules are applied to develop full color of 256 gradations, one which is highly sensitive, and one which is not highly sensitive. In a microcapsule on the printing paper P which develops full color, one color developing material among yellow, magenta, and cyan (transparent before the color development), and, a photo-curing material which is sensitive only to light of a predetermined wavelength that is complementary to the color of the color developing material and which cures by getting that light to prevent the microcapsule from being collapsed even when high pressure is applied are encapsulated.

The cassette C is used after it is inserted from a cassette insert opening 1a in the case 1 in a cassette receiving portion 15a formed in a chassis 15. When the cassette C is inserted in the cassette receiving portion 15a, first, a protrusion C2 provided on a sliding door C1 of the upper surface portion of the cassette C touches a claw 15b provided on the chassis 15 to open the sliding door C1. Then, a cassette catcher which is not shown catches the cassette C, and a leaf spring 16 provided in the chassis 15 and bent like a mountain enters an opening at the bottom of the cassette C to lift up a bottom plate C3 of the cassette C, such that the printing paper P is in close contact with a pickup roll 17.

The printing paper pickup means is formed of a supporting shaft 18 with its both ends supported by the chassis 15, the pickup roll 17 fixed in the middle of the supporting shaft 18, and a control 19 fixed at an outer end of the supporting shaft 18. When the control 19 makes a round in the direction shown by an arrow a, the pickup roll 17 feeds the top printing paper P in the cassette C until it is sandwiched between the ratchet roll 2 and the pinch roll 3. It is to be noted that the pinch roll 3 is encouraged to be pressed against the ratchet roll 2 by a spring 40. The supporting shaft 18 is made to be unrotatable in the direction opposite to the arrow a by a one-way clutch which is provided in the chassis 15 but is not shown. Further, by an index device which is provided in the chassis 15 but is not shown, after the control 19 makes a round, the supporting shaft 18 stops at a predetermined position with stability. There is a pickup confirming sensor (photointerrupter) 35 on the downstream side of the pinch roll 3 for outputting a confirming signal to the controller 12 when it confirms pickup of the printing paper P.

A printing paper feeding means is formed of roll portions 2a formed at positions of the ratchet roll 2 corresponding to both edges in the direction of the width of the printing paper P, a guide roll 36, and an endless rubber belt 39 wound on them. A lower stretched portion of the rubber belt 39 is in close contact with the both edges in the direction of the width of the printing paper P and sandwiches the printing paper P together with the pinch roll 3. When the ratchet roll 2 intermittently rotates, the printing paper P is intermittently fed so as to go below the guide roll 36 and climb up an upper surface of a baffle plate 37. The direction of the roll axis of the ratchet roll 2 and of the guide roll 36 is in parallel with the scanning direction of the carriage 6, and both ends of them are supported by the chassis 15.

Figure 4A:
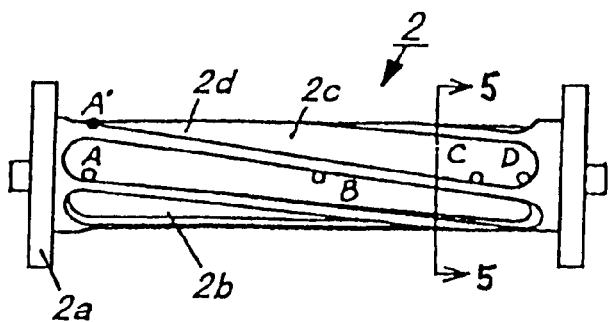
FIG. 4A and FIG. 4B are explanatory view for explaining operation of a printing paper feeding means of the printing apparatus of a photosensitive microcapsule type according to the present invention.
Figure 4B:
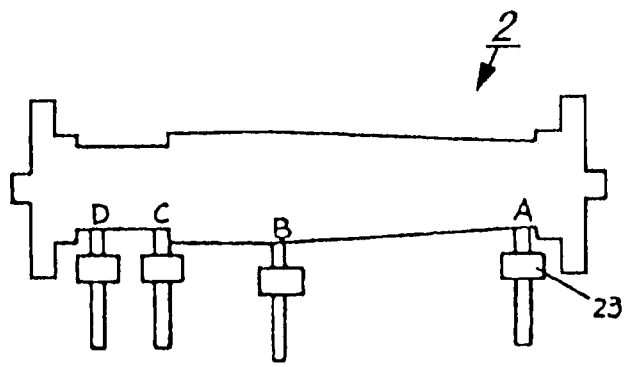
Figure 5:
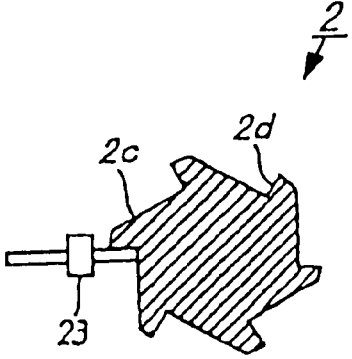
FIG. 5 is a sectional view taken along the line 5—5' in FIG. 4A.

FIG. 4A, FIG. 4B and FIG. 5 explain operation of the ratchet roll 2. The ratchet roll 2 has a twisted shaft portion 2b between the pair of roll portions 2a. A section of an operating groove 2c of the twisted shaft portion 2b is ratchet-like. More specifically, a wall 2d is formed on one side of the width of a groove while no wall is formed on the other side. The operating grooves 2c are twisted to form a predetermined angle with the center of the rotational axis of the ratchet roll 2. In the present embodiment, six operating grooves in total dividing the outer periphery of the ratchet roll 2 into six are formed, this divided angle is made to be 60°, and the operating grooves are formed from one end portions to the other end portion relatively helically by about 70°. In this way, by making the helical angle of the operating grooves a little larger than the divided angle of the operating grooves, when, during the printing operation of the printer, a claw pin 23 provided on a part of the carriage 6 moves from one end portion of one operating groove to the other end portion, the claw pin 23 slides so as to be pressed down into the carriage 6 against the elastic force of a spring 22 elastically supporting the claw pin 23 toward the ratchet roll 2, and transfers to the next, adjoining operating groove.

More specifically, suppose the starting point of the claw pin 23 in FIG. 4A, FIG. 4B is a point A. When the carriage 6 moves to the right, the claw pin 23 supported by the carriage 6 moves, together with the carriage 6, from the point A to a point B, and the claw pin 23 is gradually pressed down into the carriage 6 along the surface of the operating groove 2c. Here, though the claw pin 23 is pressed against the operating groove 2c by the spring 22, since the elastic force of the spring 22 is weak, couple which is strong enough for the claw pin 23 to reverse the ratchet roll 2 is not generated, and thus, the ratchet roll 2 stands still.

When the carriage 6 further moves and the claw pin 23 reaches a point C, the claw pin 23 transfers to the next, adjoining operation groove, and protrudes to the bottom of the operating groove 2c to reach a point D. When movement to the left this time is started from the point D, though the claw pin 23 returns following the same way as the going path from the point D. to the point C, with regard to the path from the point C to the point A, since the claw pin 23 touches the wall 2d formed only on one side of the operating groove, the claw pin 23 moves to the left sliding against the wall 2d of the operating groove to reach a point A'. In practice, the claw pin 23 reciprocates between the point D and the point A, and thus, the ratchet roll 2 is rotated until the point A' falls on the point A.

Here, if the helical angle of the operating grooves equals to or is smaller than the divided angle, the claw pin 23 can not transfer to the next operating groove, and, if the helical angle is twice as large as the divided angle or more, the claw pin 23 is engaged with the operating groove next to the adjoining one, and thus, the helical angle of the operating grooves must be larger than the divided angle and smaller than twice the divided angle. If the helical angle is in this range, regardless of the value of the helical angle, the rotational angle at a time of the ratchet roll 2 is regulated by the divided angle of the operating grooves.

According to the mechanism described above, not only the reciprocating operation of the carriage can be converted to the rotational operation of the ratchet roll quite easily, but also, since the ratchet roll always rotates in the direction of paper feed, that is, unidirectionally, feeding by mistake the printing paper P in the reverse direction does not occur, and the amount of paper feed at a time is quite accurate. Further, since the ratchet roll forms a one-way ratchet, it is also possible that, as the need arises, an arbitrary amount of printing paper can be drawn out in the discharging direction of the printing paper at an arbitrary position. Further, since the number of parts is small, as a result, miniaturization can be carried out, the cost is lowered, and the reliability is improved.

The reciprocating movement of the carriage 6 is carried out by the rotation of the scan shaft 5. In the scanning shaft 5, a clockwise spiral groove, and, a counterclockwise spiral groove, the pitch thereof being twice as much, are grooved so as to cross each other on the way and such that both ends thereof are connected to form a loop. The carriage 6 is slidably fitted on the scan shaft 5 and the guide shaft 34. A pin 20 is inserted in a hole opened in the carriage 6, and a pin 38 for preventing escape is driven in from the side so as to cross the pin 20 and makes the pin 20 unescapable. An inner end portion of the pin 20 having a small diameter is engaged with the spiral groove grooved in the scan shaft 5.

Accordingly, when the motor 4 is rotated in the direction shown by an arrow b to rotate through a train 21 of gears the scan shaft 5 in the direction shown by an arrow c, the carriage 6 reciprocates. As described in the above, when the claw pin 23 returns in the direction opposite to an arrow d, a side surface of a lower end portion of the claw pin 23 presses a wall 2d to make the ratchet roll 2 intermittently rotate. The roll portions 2a of the ratchet roll 2 sandwiches the printing paper P in conjunction with the pinch roll 3. For example, in case the resolution is 150 dpi, the intermittent feeding is about 0.2 mm.

With regard to the light emitting diodes 7, one for emitting light of the red wavelength, one for emitting light of the green wavelength, and one for emitting light of the blue wavelength are formed on a substrate 24 attached to the carriage 6. During the going movement of the carriage 6 in the direction shown by the arrow d, the light emitting diodes 7 emit light corresponding to image data exchanged between the image processing apparatus B and the controller 12. The light is, after the light diameter is decreased by pinholes of an aperture 25 attached to the substrate 24 and in proximity of the printing paper P, irradiated onto the printing paper P to make uncollapsible microcapsules which get light of predetermined wavelengths.

A pressurizing means for applying pressure to the printing paper P is formed of a pair of rolling rolls 26 and 27 circumscribing with each other with their both end shaft portions engaged with a long hole provided in the carriage 6, and a platen 29 provided so as to face the rolling rolls 26 and 27. The platen 29 is structured to be pressed towards the rolling roll 26 by a spring 28 and to be pressed down toward the direction opposite to the rolling roll 26 by a cam 32 driven by a rotary actuator 31.

During the going movement of the carriage 6 as shown by the arrow d, the rotary actuator 31 is driven to rotate the cam 32 by 90 degrees and the pressing down of the platen 29 by the cam 32 is released to make the platen 29 pressed toward the direction of the rolling roll 26. With this state maintained, the one rolling roll 26 is made to roll on the printing paper P guided by the platen 29, and the other rolling roll 27 is made to roll below a pressurization rail 30 fixed along the scanning direction of the chassis 15, to suppress lifting off of the rolling rolls 26 and 27 and apply pressure to the printing paper P to which the light is irradiated.

During the returning movement of the carriage 6 in the direction opposite to the arrow d, the rotary actuator 31 is driven to reverse to rotate the cam 32 by 90 degrees in the opposite direction to make the cam 32 press down the platen 29. Meanwhile, the rolling roll 26 moves above the printing paper P without applying pressure. Further, the printing paper feeding means is structured to, here, feed the printing paper P intermittently with intervals.

It is to be noted that the contact between the platen 29 and the rolling roll 26 is point contact, and the pressure applied by the spring 28 is adjusted such that the contact pressure is about 500 g-1 Kg.

The heater 8 as the color development facilitating means is provided on the carriage 6 and is structured to be in slidable contact with the pressurized printing paper P guided onto a leaf spring 33 attached to the chassis 15 to heat the printing paper P, thereby accelerating the color developing speed.

The scanning position detecting means is structured to detect the scanning position of the carriage 6 by reading the graduations of the linear scale 10 applied to the pressurization rail 30 with the linear sensor 9 provided on the carriage 6.

In the printing paper specifying means, the bar code sensor 11 is provided on the lower surface of the carriage 6, and the bar code C4 is displayed on the upper surface of the protrusion C2 provided on the sliding door C1 of the upper surface portion of the cassette C. The printing paper specifying means is structured such that, when the carriage 6 reciprocates for the first time, the bar code sensor 11 reads the bar code C4 and the controller 12 specifies the kind of the printing paper P contained in the cassette C.

The controller 12 is formed with a one-chip microcomputer and other electronic components mounted on the substrate.

When an ON signal of a print switch of the printing apparatus A is inputted and a pickup confirming signal of the pickup confirming sensor 35 is inputted, the controller 12 controls the respective portions to carry out a series of operation for initial setting. First, the controller 12 outputs a motor drive signal such that the carriage 6 goes to the right and to the left once to drive the motor 4 to rotate. During the going movement of the carriage 6, the controller 12 inputs a signal as a result of reading by the linear sensor 9 of the graduations of the linear scale 10, and detects that the carriage 6 comes to the home position of an end close to the motor to make correction necessary for positioning. Further, during the going movement or the returning movement for the first time of the carriage 6, the controller 12 inputs a signal as a result of reading of the bar code C4 attached to the cassette C by the bar code sensor 11 to specify the kind of the printing paper P contained in the cassette C. Then, the controller 12 carries out initial adjustment in which, according to the kind of the printing paper, a program for setting the intensity or irradiation time of the light of the light emitting diodes 7 is selected from a ROM.

Further, when an ON signal of a selected image print output switch of a digital camera B or of the print switch of the printing apparatus is inputted, the controller 12 controls the respective portions to carry out a series of operation for exposure and development of the printing paper.

When image data selected with the digital camera B is inputted, after operation to make the data as electric signals for making the light emitting diodes 7 emit light, a motor drive signal for driving the motor 4 to rotate is outputted, a signal for making the linear sensor 9 read the graduations of the linear scale 10 is inputted to detect the accurate scanning position of the carriage 6, and, based on the detection signal, the electric signals corresponding to the image data are outputted to the light emitting diodes 7. This operation is repeated until input of pickup confirming signal from the pickup confirming sensor 35 stops and until it is immediately before the completion of the intermittent feeding of the printing paper P by the belt 37.

The input display device 13 is made of a liquid crystal panel and the like, is attached on the inner surface of the case 1, and is structured to exchange signals with the controller 12 and to display necessary data.

The battery 14 can be replaced by taking it in and out in the direction of a side of the case 1.

The present invention includes the following technical content.

(1) The printing paper feeding means may carry out the intermittent feeding by sandwiching the printing paper P between the roll portions 2a of the ratchet roll 2 and the pinch roll 3 without the wound rubber belt 39.

(2) The arrangement of the printing paper feeding means may be such that the wound rubber belt 39 and the roll portions 2a of the ratchet roll 2 are eliminated, the ratchet roll 2 and the guide roll 36 are connected through three gears to make it possible to transmit the intermittent rotation of the ratchet roll 2 to the guide roll 36, and the pinch roll 3 is in contact with the guide roll 36. In this arrangement, since the end of the stroke of the claw pin 23 is not limited by the roll portions 2a, print over the whole width from one end to the other end of the printing paper P can be carried out.

(3) The printing paper feeding means may be structured so as to be provided with a feed roll with its roll axis being in parallel with the scanning direction of the scanning head and a pinch roll in contact with the feed roll to rotate, such that the feed roll is intermittently rotated through an intermittently rotating mechanism by the motor shown in FIG. 1 or another motor to intermittently feed the printing paper sandwiched between the feed roll and the pinch roll. In order to carry out printing with regard to the side of the trailing end in the feeding direction of the printing paper P, it is preferable that the feed roll and the pinch roll are provided on the downstream side of the heater 8 and the feed rolls on the upstream side and on the downstream side are connected by a train of gears or the like.

(4) The pressurizing means may be a pair of pressurization rolls provided such that its roll axis is in parallel with the scanning direction of the scanning head structured so as to sandwich and apply pressure to the printing paper and to be intermittently rotated in synchronous with the printing paper feeding means.

(5) The printing paper pickup means may be structured such that, by rotating the pickup roll 17 shown in FIG. 2 by the motor shown in FIG. 1 or another motor, the printing paper is automatically fed from the cassette inserted in the cassette insert opening in the case to a place from which the printing paper is intermittently fed by the printing paper feeding means.

(6) The scanning position detecting means may use a tachogenerator provided in the motor structured such that, based on the rotational angle or the number of rotations of the motor detected by the tachogenerator, the scanning position of the carriage 6 is detected.

As described above, according to a printing apparatus of a photosensitive microcapsule type and an image processing system using the printing apparatus of the present invention, printing paper of a photosensitive microcapsule type can be made to generate an image by irradiating light corresponding to image data to selectively cure photosensitive microcapsules, and after that, applying pressure to collapse microcapsules which have not cured, and developing the color of a color developing material which is brought into contact with an image receiving layer.

Further, according to a printing apparatus of the present invention, since a carriage is structured to be made to scan by a scan shaft having a spiral groove and a carriage provided with a pin engaged with the spiral groove, a structure for making the carriage scan can be miniaturized, which makes it possible to microminiaturize the body of the printing apparatus to be as small as a cigarette case.

Further, according to a printing apparatus of the present invention, since it is structured such that a cassette for containing printing paper is provided with a code for specifying the kind of the printing paper, and a sensor provided on a carriage reads the code to specify the printing paper, the cassette can be freely exchanged even if all the printing paper is not used up.

Further, according to a printing apparatus of the present invention, since a printing paper feeding means is structured such that a protruding member for elastically protruding from and withdrawing into a carriage is provided and a paper feed roller with a plurality of operating grooves, a section thereof being ratchet-like for engaging with the protruding member, is provided, printing paper can be intermittently fed in an extremely simple structure.

What is claimed is:

1. A printing apparatus of a photosensitive microcapsule type comprising:

a cassette for storing printing paper containing photosensitive microcapsules;

printing paper feeding means for intermittently feeding the printing paper in a feeding direction;

printing paper pickup means for manually or automically feeding the printing paper from the cassette to a preselected location from which the printing paper is intermittently fed by the printing paper feeding means;

a chassis;

a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop;

a motor connected to the chassis for rotating the scan shaft;

a carriage slidably mounted on the scan shaft and having a pin for engagement with the first and second spiral grooves to reciprocate the carriage along the scan shaft during rotation of the scan shaft;

light emitting diodes disposed on the carriage and in proximity to the printing paper for selectively irradiating onto the printing paper light corresponding to image data when the carriage is reciprocated along the scan shaft; and pressurizing means for applying pressure to the printing paper to which light is irradiated by the light emitting diodes to collapse the photosensitive microcapsules contained in the printing paper to form an image on the printing paper.

2. A printing apparatus of a photosensitive microcapsule type according to claim 1; further comprising a case having an insert opening for receiving the cassette.

3. A printing apparatus of a photosensitive microcapsule type according to claim 1; wherein the printing paper feeding means comprises an intermittently rotating mechanism for intermittently feeding the print paper; and further comprising means for intermittently rotating the intermittently rotating mechanism.

4. A printing apparatus of a photosensitive microcapsule type according to claim 3; wherein the means for intermittently rotating the intermittently rotating mechanism comprises the motor.

5. A printing apparatus of a photosensitive microcapsule type according to claim 3; wherein the means for intermittently rotating the intermittently rotating mechanism comprises a motor independent from the motor connected to the chassis for rotating the scan shaft.

6. In an image processing system having an image processing apparatus for generating an image signal containing image data, a printing apparatus of a photosensitive microcapsule type as claimed in claim 1 for generating the image on the printing paper in accordance with the image signal from the image processing apparatus.

7. A printing apparatus of a photosensitive microcapsule type comprising: printing paper feeding means for intermittently feeding printing paper containing photosensitive microcapsules in a feeding direction; a chassis; a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop; a motor connected to the chassis for rotating the scan shaft; a carriage slidably mounted on the scan shaft and having a pin for engagement with the first and second spiral grooves to reciprocate the carriage along the scan shaft to and from a print start position during rotation of the scan shaft; light emitting diodes disposed on the carriage and in proximity to the printing paper for selectively irradiating onto the printing paper light corresponding to image data when the carriage is reciprocated along the scan shaft; and pressurizing means for applying pressure to the printing paper to which light is irradiated by the light emitting diodes to collapse the Photosensitive microcapsules contained in the printing paper to form an image on the printing paper; wherein the printing paper feeding means comprises a protruding member disposed in the carriage for elastically protruding from and withdrawing into the carriage, a paper feed roller having a rotational center axis extending generally parallel to the moving direction of the carriage, and a plurality of helical operating grooves formed in an outer peripheral portion of the paper feed roller for engaging the protruding member to rotate the paper feed roller during movement of the carriage to the print start position, the operating grooves being disposed generally parallel to one another and extending along the rotational center axis of the paper feed roller.

8. A printing apparatus of a photosensitive microcapsule type according to claim 7; wherein each of the operating grooves has a generally ratchet-like cross-sectional shape.

9. In an image processing system having an image processing apparatus for generating an image signal containing image data, a printing apparatus of a photosensitive microcapsule type as claimed in claim 7 for generating the image on the printing paper in accordance with the image signal from the image processing apparatus.

10. A printing apparatus of a photosensitive microcapsule type comprising: printing paper feeding means for intermittently feeding printing paper containing photosensitive microcapsules in a feeding direction; a chassis; a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop; a motor connected to the chassis for rotating the scan shaft; a carriage slidably mounted on the scan shaft and having a pin for engagement with the spiral grooves to undergo movement along the scan shaft in a scanning direction during rotation of the scan shaft; light emitting diodes disposed on the carriage and in proximity to the printing paper for selectively irradiating onto the printing paper light corresponding to image data when the carriage is reciprocated along the scan shaft; and pressurizing means for applying pressure to the printing paper to which light is irradiated by the light emitting diodes to collapse the photosensitive microcapsules contained in the printing paper to form an image on the printing paper, the pressurizing means comprising a platen for guiding the printing paper, a spring for biasing the platen into contact with the printing paper, a pressurization rail mounted on the chassis and extending along the scanning direction, and a pair of rollers each mounted for undergoing rolling movement on the platen and the pressurization rail, respectively during movement of the carriage.

11. In an image processing system having an image processing apparatus for generating an image signal containing image data, a printing apparatus of a photosensitive microcapsule type as claimed in claim 10 for generating the image on the printing paper in accordance with the image signal from the image processing apparatus.

12. A printing apparatus of a photosensitive microcapsule type comprising: printing paper feeding means for intermittently feeding printing paper containing photosensitive microcapsules in a feeding direction; a chassis; a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop; a motor connected to the chassis for rotating the scan shaft; a carriage slidably mounted on the scan shaft and having a pin for engagement with the first and second spiral grooves to undergo movement along the scan shaft in a scanning direction during rotation of the scan shaft; light emitting diodes disposed on the carriage and in proximity to the printing paper for selectively irradiating onto the printing paper light corresponding to image data during movement of the carriage along the scan shaft; pressurizing means for applying pressure to the printing paper to which light is irradiated by the light emitting diodes to collapse the photosensitive microcapsules contained in the printing paper to form an image on the printing paper; and a heater for undergoing sliding contact with the printing paper during movement of the carriage along the scan shaft to heat the printing paper to accelerate the color developing speed of the image generated on the printing paper.

13. In an image processing system having an image processing apparatus for generating an image signal containing image data, a printing apparatus of a photosensitive microcapsule type as claimed in claim 12 for generating the image on the printing paper in accordance with the image signal from the image processing apparatus.

14. A printing apparatus of a photosensitive microcapsule type comprising: printing paper feeding means for intermittently feeding printing paper containing photosensitive microcapsules in a feeding direction; a chassis; a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop; a motor connected to the chassis for rotating the scan shaft; a carriage slidably mounted on the scan shaft and having a pin for engagement with the first and second spiral grooves to undergo movement along the scan shaft in a scanning direction during rotation of the scan shaft; scanning position detecting means for detecting a scanning position of the carriage; light emitting diodes disposed on the carriage and in proximity to the printing paper for selectively irradiating onto the printing paper light corresponding to image data during movement of the carriage along the scan shaft; and pressurizing means for applying pressure to the printing paper to which light is irradiated by the light emitting diodes to collapse the photosensitive microcapsules contained in the printing paper to form an image on the printing paper.

15. A printing apparatus of a photosensitive microcapsule type as claimed in claim 14; wherein the scanning position detecting means comprises a linear scale extending along the scanning direction of the carriage; and a linear sensor disposed on the carriage for reading the linear scale to detect the scanning position of the carriage.

16. A printing apparatus of a photosensitive microcapsule type as claimed in claim 14; wherein the scanning position detecting means comprises a tachometer disposed in the motor for detecting a rotational angle of the motor; and wherein the scanning position of the carriage is detected based on the rotational angle of the motor detected by the tachometer.

17. In an image processing system having an image processing apparatus for generating an image signal containing image data, a printing apparatus of a photosensitive microcapsule type as claimed in claim 14 for generating the image on the printing paper in accordance with the image signal from the image processing apparatus.

18. A printing apparatus of a photosensitive microcapsule type as claimed in claim 14 wherein the scanning position detecting means comprises a tachometer disposed in the motor for detecting a number of rotations of the motor; and wherein the scanning position of the carriage is detected based on the number of rotations of the motor detected by the tachometer.

19. In an image processing system having an image processing apparatus for generating an image signal containing image data, a printing apparatus of a photosensitive microcapsule type as claimed in claim 15 for generating the image on the printing paper in accordance with the image signal from the image processing apparatus.

20. In an image processing system having an image processing apparatus for generating an image signal containing image data, a printing apparatus of a photosensitive microcapsule type as claimed in claim 16 for generating the image on the printing paper in accordance with the image signal from the image processing apparatus.

21. A printing apparatus of a photosensitive microcapsule type comprising:
  a cassette for storing printing paper containing photosensitive microcapsules;
  a bar code disposed on the cassette representative of the type of printing paper stored in the cassette;
  printing paper feeding means for intermittently feeding the printing paper in a feeding direction;
  a chassis;
  a scan shaft having opposite ends mounted on the chassis for undergoing rotation about a rotational axis extending generally perpendicular to the feeding direction of the printing paper, a first spiral groove formed in the scan shaft along a clockwise direction and having opposite ends, and a second spiral groove formed in the scan shaft along a counterclockwise direction and having opposite ends each connected to a respective end of the first spiral groove so that the first and second spiral grooves form a loop;
  a motor connected to the chassis for rotating the scan shaft;
  a carriage slidably mounted on the scan shaft and having a pin for engagement with the first and second spiral grooves to reciprocate the carriage along the scan shaft during rotation of the scan shaft;
  a bar code sensor connected to the carriage for reading the bar code disposed on the cassette to identify the type of printing paper stored in the cassette;
  light emitting diodes disposed on the carriage and in proximity to the printing paper for selectively irradiating onto the printing paper light corresponding to image data when the carriage is reciprocated along the scan shaft; and
  pressurizing means for applying pressure to the printing paper to which light is irradiated by the light emitting diodes to collapse the photosensitive microcapsules contained in the printing paper to form an image on the printing paper, image data, a printing apparatus of a photosensitive microcapsule type as claimed in claim 15 for generating the image on the printing paper in accordance with the image signal from the image processing apparatus.

22. In an image processing system having an image processing apparatus for generating an image signal containing image data, a printing apparatus of a photosensitive microcapsule type as claimed in claim 21 for generating the image on the printing paper in accordance with the image signal from the image processing apparatus.

23. A printing apparatus of a photosensitive microcapsule type comprising: a chassis; a cassette supported by the chassis for storing printing paper containing photosensitive microcapsules; feeding means for intermittently feeding the printing paper in a feeding direction; pickup means for feeding the printing paper from the cassette to a preselected location from which the printing paper is intermittently fed by the feeding means; a scan shaft mounted on the chassis for undergoing rotation, the scan shaft having a first helical-shaped groove formed in a peripheral surface thereof and having opposite ends and a second helical-shaped groove formed in the peripheral surface thereof and having opposite ends each connected to a respective end of the first helical-shaped groove so that the first and second helical-shaped grooves form a loop; a carriage slidably mounted on the scan shaft for undergoing reciprocal movement along the scan shaft during rotation of the scan shaft; a plurality of light emitting diodes disposed on the carriage for selectively irradiating onto the printing paper light corresponding to image data when the carriage is reciprocated along the scan shaft; and pressurizing means for applying pressure to the printing paper to which light is irradiated by the light emitting diodes to collapse the photosensitive microcapsules contained in the printing paper to form an image on the printing paper.

\* \* \* \* \*